United States Patent
Park

(10) Patent No.: US 9,029,989 B2
(45) Date of Patent: May 12, 2015

(54) SEMICONDUCTOR PACKAGE AND SEMICONDUCTOR DEVICES WITH THE SAME

(71) Applicant: Soojeoung Park, Hwaseong-si (KR)

(72) Inventor: Soojeoung Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/969,053

(22) Filed: Aug. 16, 2013

(65) Prior Publication Data

US 2014/0084446 A1 Mar. 27, 2014

(30) Foreign Application Priority Data

Sep. 24, 2012 (KR) .......................... 10-2012-0105828

(51) Int. Cl.
| | |
|---|---|
| *H01L 21/48* | (2006.01) |
| *H01L 23/373* | (2006.01) |
| *H01L 23/552* | (2006.01) |
| *H01L 23/36* | (2006.01) |
| *H01L 25/065* | (2006.01) |
| *H01L 25/10* | (2006.01) |

(52) U.S. Cl.
CPC .......... *H01L 23/373* (2013.01); *H01L 2224/16* (2013.01); *H01L 2224/73253* (2013.01); *H01L 2924/0002* (2013.01); *H01L 2924/15311* (2013.01); *H01L 23/36* (2013.01); *H01L 23/552* (2013.01); *H01L 25/0652* (2013.01); *H01L 25/105* (2013.01)

(58) Field of Classification Search
CPC .................... H01L 23/3114; H01L 23/49861; H01L 23/4951
USPC .............. 257/629, 712, 732, E23.08, 21.499, 257/25.013
See application file for complete search history.

(56) References Cited

U.S. PATENT DOCUMENTS

| | | | |
|---|---|---|---|
| 5,834,337 A | 11/1998 | Unger et al. | |
| 6,404,070 B1 | 6/2002 | Higashi et al. | |
| 6,737,750 B1 * | 5/2004 | Hoffman et al. ............... | 257/777 |
| 6,740,959 B2 * | 5/2004 | Alcoe et al. ................... | 257/659 |
| 6,864,120 B2 | 3/2005 | Murayama et al. | |
| 7,002,805 B2 * | 2/2006 | Lee et al. ....................... | 361/704 |
| 7,112,472 B2 | 9/2006 | Dubin | |
| 7,195,951 B2 | 3/2007 | Houle et al. | |
| 7,217,998 B2 * | 5/2007 | Tamagawa et al. ............ | 257/707 |
| 7,301,232 B2 * | 11/2007 | Leu et al. ....................... | 257/712 |
| 7,332,823 B2 * | 2/2008 | Khaw et al. .................... | 257/787 |
| 7,880,298 B2 | 2/2011 | Drake et al. | |
| 8,044,494 B2 * | 10/2011 | Mistry et al. .................. | 257/659 |
| 8,143,097 B2 * | 3/2012 | Chi et al. ....................... | 438/107 |
| 2003/0025180 A1 * | 2/2003 | Alcoe et al. ................... | 257/659 |
| 2006/0033203 A1 * | 2/2006 | Leu et al. ....................... | 257/706 |

(Continued)

FOREIGN PATENT DOCUMENTS

| | | |
|---|---|---|
| JP | 07-288298 | 10/1995 |
| JP | 11-297895 | 10/1999 |

(Continued)

*Primary Examiner* — Michael Lebentritt

(74) *Attorney, Agent, or Firm* — Myers Bigel Sibley & Sajovec, P.A.

(57) ABSTRACT

A semiconductor package includes a substrate, a ground circuit supported by the substrate, at least one semiconductor chip disposed on the substrate and a carbon-containing heat-dissipating part disposed on the substrate and electrically connected to the ground circuit. The heat-dissipating part may include carbon fibers and/or carbon cloth.

19 Claims, 26 Drawing Sheets

(56) References Cited

U.S. PATENT DOCUMENTS

| | | | |
|---|---|---|---|
| 2007/0053166 A1* | 3/2007 | Hwang et al. | 361/717 |
| 2007/0096343 A1 | 5/2007 | Yoon et al. | |
| 2007/0138656 A1* | 6/2007 | Khaw et al. | 257/787 |
| 2008/0137307 A1* | 6/2008 | Orr et al. | 361/719 |
| 2009/0260858 A1* | 10/2009 | Nakai et al. | 174/252 |
| 2011/0139329 A1* | 6/2011 | Clayton et al. | 156/53 |
| 2011/0146279 A1* | 6/2011 | Graeber et al. | 60/661 |
| 2011/0147901 A1* | 6/2011 | Huang et al. | 257/660 |
| 2011/0233736 A1* | 9/2011 | Park et al. | 257/659 |
| 2012/0103714 A1 | 5/2012 | Choi et al. | |
| 2012/0241942 A1* | 9/2012 | Ihara | 257/712 |
| 2013/0299974 A1* | 11/2013 | Chi et al. | 257/737 |

FOREIGN PATENT DOCUMENTS

| | | |
|---|---|---|
| JP | 2004-247630 | 9/2004 |
| KR | 1020060081749 | 7/2006 |
| KR | 100649754 | 11/2006 |
| KR | 1020120044853 | 5/2011 |
| KR | 1020110116719 | 10/2011 |
| KR | 1020120041625 | 5/2012 |

* cited by examiner

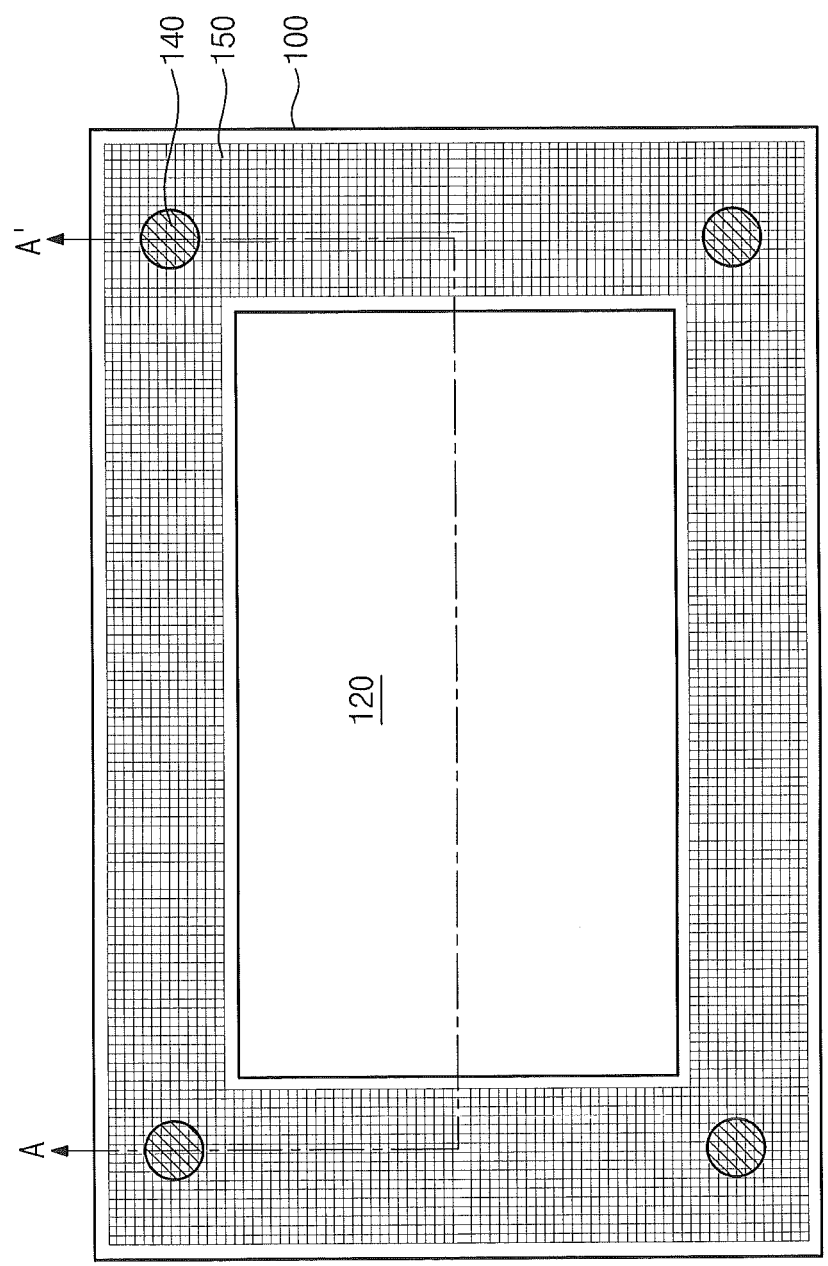

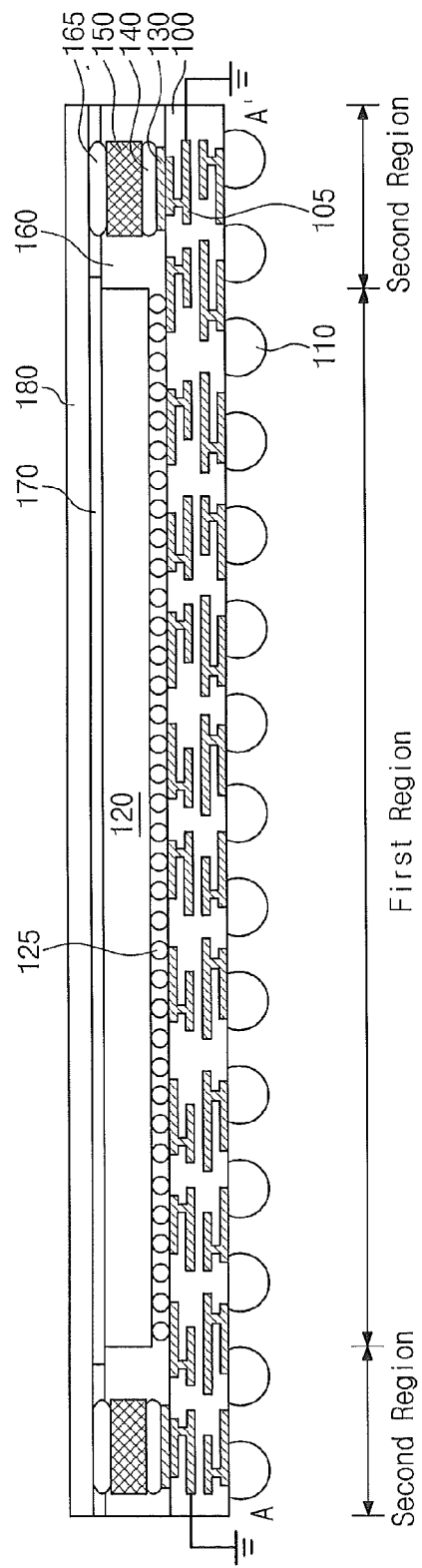
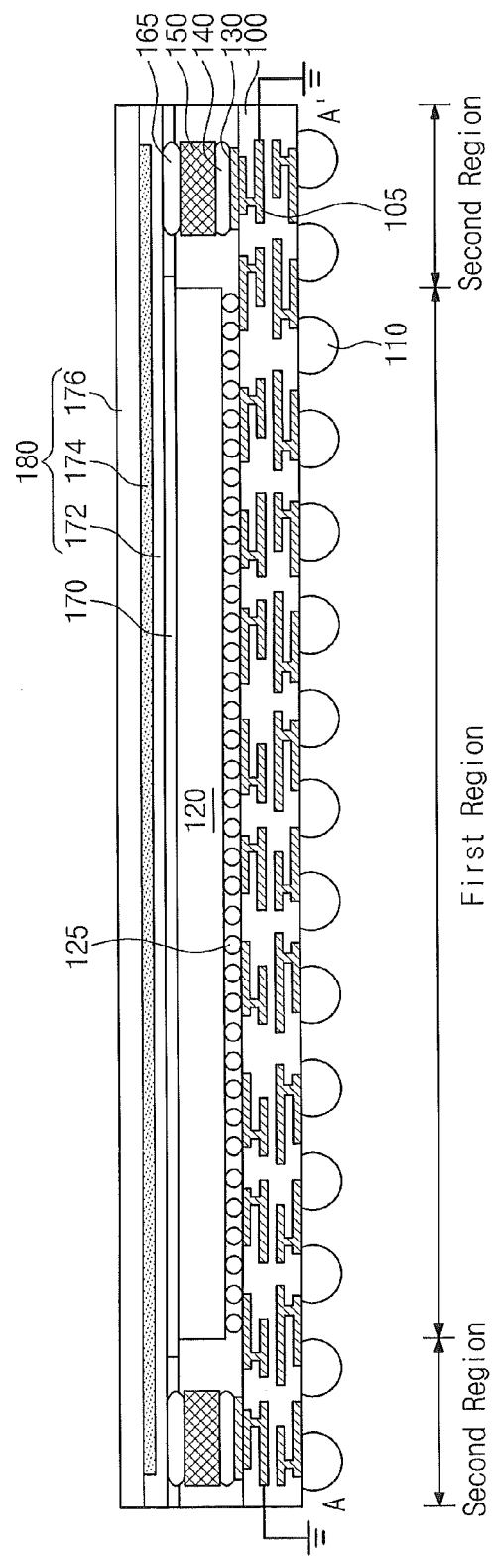

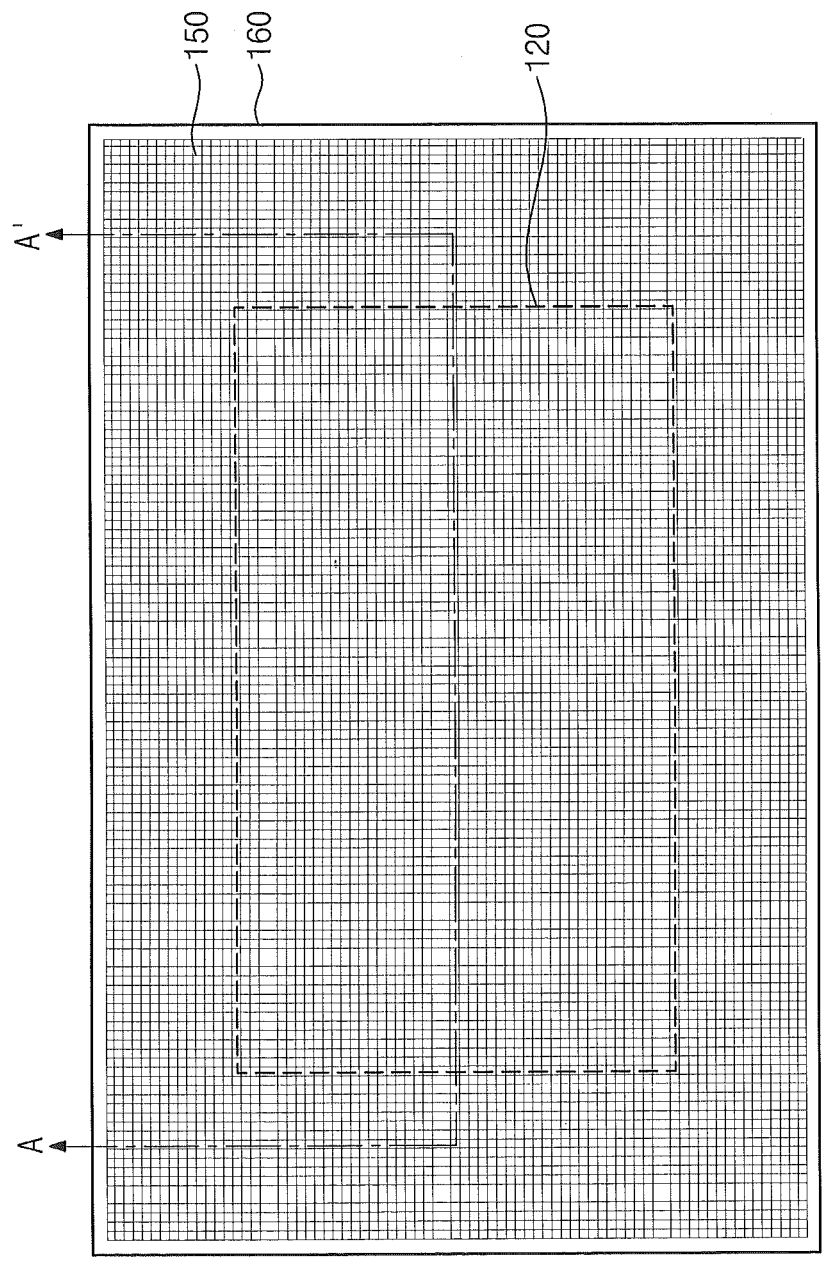

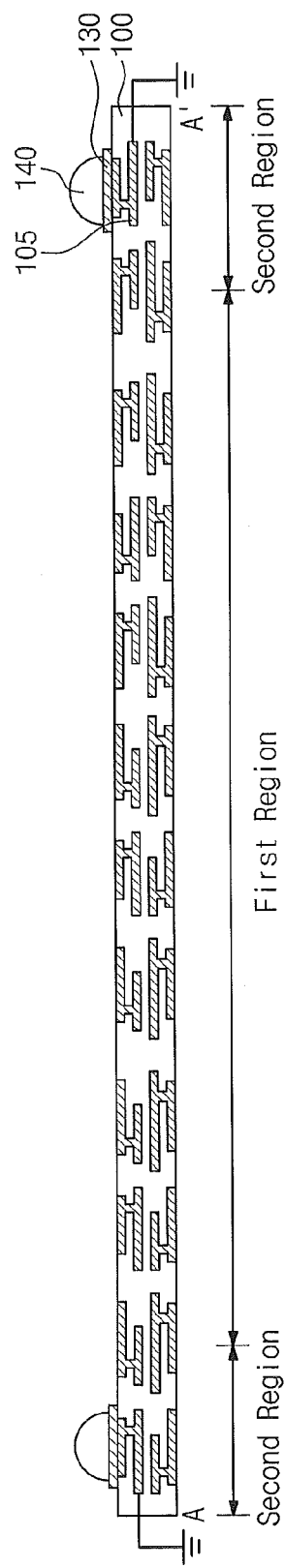

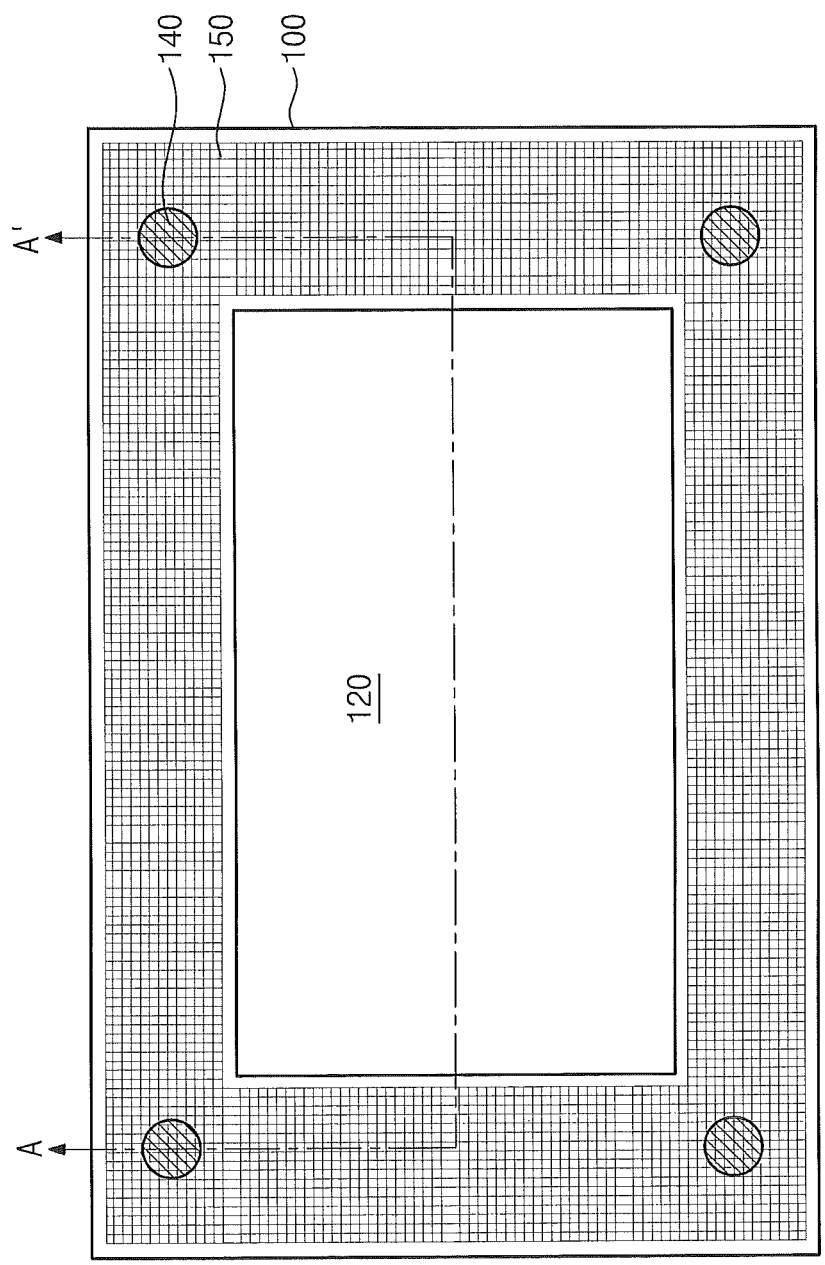

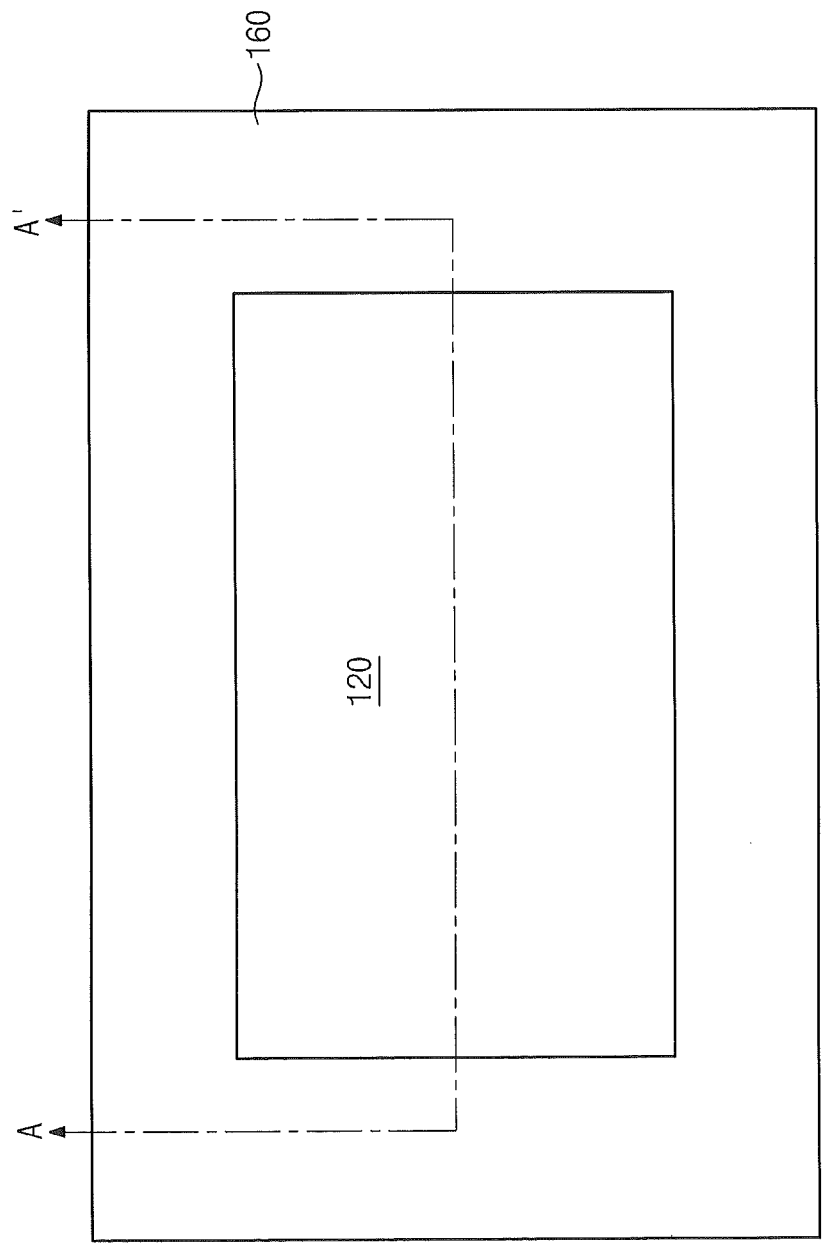

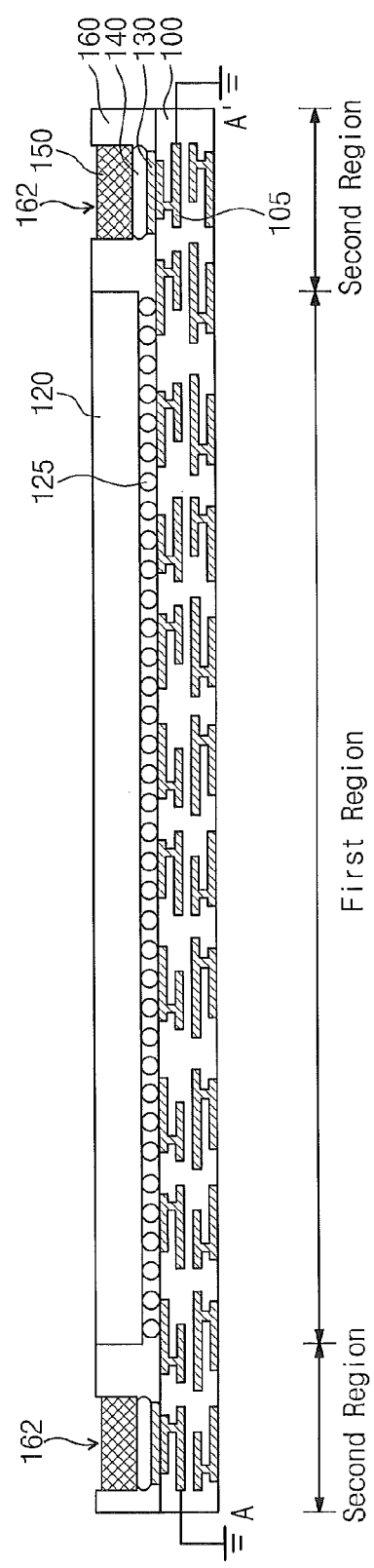

SEMICONDUCTOR PACKAGE AND SEMICONDUCTOR DEVICES WITH THE SAME

CROSS-REFERENCE TO RELATED APPLICATIONS

This U.S. non-provisional patent application claims priority under 35 U.S.C. §119 to Korean Patent Application No. 10-2012-0105828, filed on Sep. 24, 2012, in the Korean Intellectual Property Office, the entire contents of which are hereby incorporated by reference.

BACKGROUND OF THE INVENTION

Example embodiments of the inventive subject matter relate to semiconductor package and device, and in particular, to a semiconductor package with a heat-dissipating part and a semiconductor device with the same.

Higher integration of semiconductor devices is required to satisfy consumer demands for electronic devices. However, there may be technical difficulties in processes for fabricating highly integrated devices (e.g., reduced photolithograph process margin), which may make it difficult to realize highly-integrated semiconductor devices. To overcome such limitations, there have been studies of new technology for increasing integration density and performance of semiconductor devices.

SUMMARY

Example embodiments of the inventive subject matter provide a semiconductor package including a substrate, a ground circuit supported by the substrate, at least one semiconductor chip disposed on the substrate and a carbon-containing heat-dissipating part disposed on the substrate and electrically connected to the ground circuit. The heat-dissipating part may include carbon fibers and/or carbon cloth.

In some embodiments, the package may further include a connection pattern disposed adjacent to the at least one semiconductor chip and configured to electrically connect the ground circuit to the heat-dissipating part.

In some embodiments, the heat-dissipating part may be spaced apart from the at least one semiconductor chip and extend along a periphery of the at least one semiconductor chip. The heat-dissipating part may have a top surface that is lower than or substantially coplanar with a top surface of the at least one semiconductor chip.

In some embodiments, the heat-dissipating part may at least partially cover a top surface of the at least one semiconductor chip.

In some embodiments, the package may include a molding part covering the heat-dissipating part. In some embodiments, the package may include a molding part disposed on the substrate and covering the semiconductor chip and the heat-dissipating part.

In further embodiments, the heat-dissipating part may include a first heat-dissipating part disposed adjacent a periphery of the semiconductor chip. The package may further include a second heat-dissipating part overlying the semiconductor chip and electrically connected to the first heat-dissipating part. The second heat-dissipating part may include metal and/or graphite.

In some embodiments, the at least one semiconductor chip may include a plurality of semiconductor chips stacked on the substrate.

According to some embodiments of the inventive subject matter, a semiconductor device includes a first semiconductor package comprising a first substrate, at least one first semiconductor chip disposed on the first substrate and a ground circuit supported by the first substrate. The semiconductor device further includes a second package disposed on the first package and comprising a second substrate, at least one second semiconductor chip disposed on the second substrate, and a carbon-containing heat-dissipating part disposed on the substrate. A connecting part connects the heat-dissipating part of the second package to the ground circuit of the first package.

In some embodiments, the second package further comprises a molding part disposed on the second substrate and covering the heat-dissipating part.

In some embodiments, the heat-dissipating part may be disposed along a periphery of the at least one second semiconductor chip and may have a top surface that is lower than or substantially coplanar with a top surface of the at least one second semiconductor chip.

In some embodiments, the heat-dissipating part may include a first heat-dissipating part disposed along a periphery of the at least one second semiconductor chip and the semiconductor device includes a second heat-dissipating part electrically connected to the first heat-dissipating part and comprising metal and/or graphite.

Further embodiments of the inventive subject matter provide a packaged semiconductor device including a substrate, a ground circuit supported by the substrate, at least one semiconductor chip disposed on the substrate, a molded region disposed on the substrate and conforming to at least one sidewall of the at least one semiconductor chip and a carbon-containing region disposed in the molded region adjacent a periphery of the at least one semiconductor chip and connected to the ground circuit. The carbon-containing region may be thermally and electrically conductive.

In some embodiments, the molded region at least partially covers a top surface of the at least one semiconductor chip.

In some embodiments, the packaged semiconductor device may further include a metal and/or graphite containing region overlying the at least one semiconductor chip and connected to the carbon-containing region. The carbon-containing region may include carbon fibers and/or carbon cloth.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a plan view illustrating a semiconductor package according to example embodiments of the inventive subject matter.

FIGS. 3A and 3B are sectional views illustrating semiconductor packages according to further example embodiments of the inventive subject matter.

FIG. 4A is a plan view illustrating a semiconductor package according to still further example embodiments of the inventive subject matter.

FIGS. 6A through 10A are plan views illustrating fabrication of a semiconductor package according to example embodiments of the inventive subject matter.

FIGS. 6B through 10B are sectional views illustrating fabrication of a semiconductor package according to example embodiments of the inventive subject matter.

FIG. 11A through 13A are plan views illustrating fabrication of a semiconductor package according to further example embodiments of the inventive subject matter.

FIG. 11B through 13B are sectional views illustrating fabrication of a semiconductor package according to further example embodiments of the inventive subject matter.

Figure 2A:
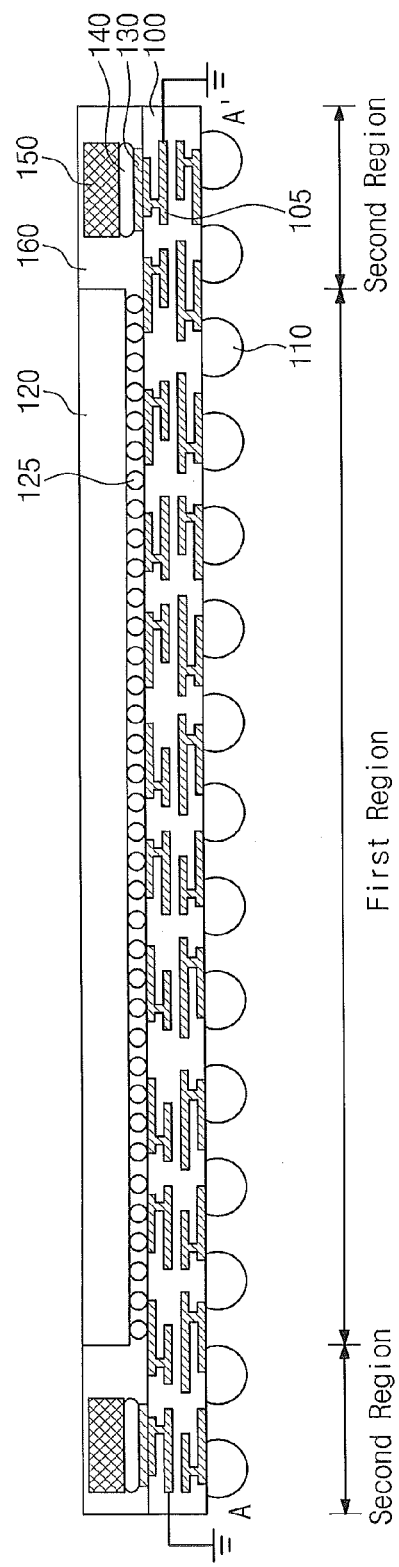
FIGS. 2A through 2C are sectional views illustrating semiconductor packages according to example embodiments of the inventive subject matter.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive subject matters will now be described more fully with reference to the accompanying drawings, in which example embodiments are shown. Example embodiments of the inventive subject matters may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive subject matters are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive subject matters should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive subject matters belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2B:
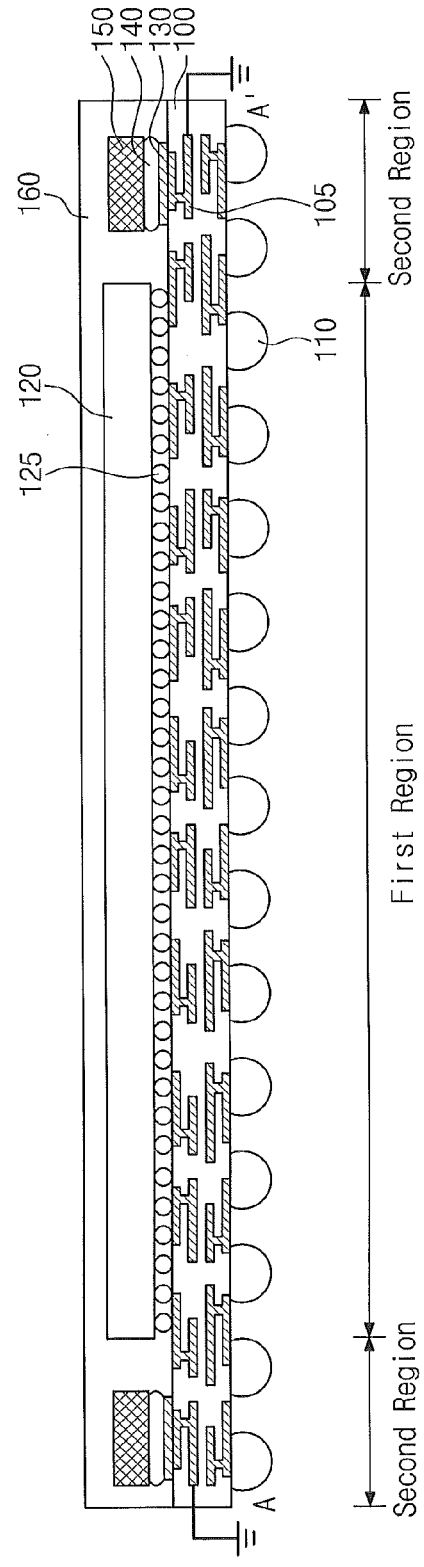
Figure 2C:
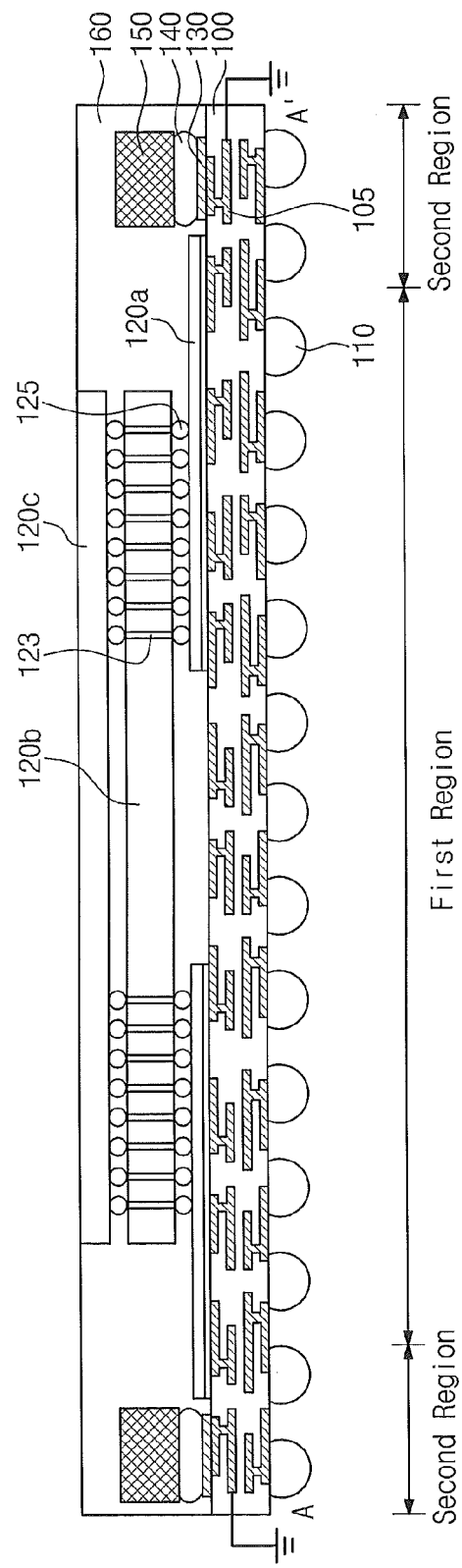

FIG. 1 is a plan view illustrating a semiconductor package according to example embodiments of the inventive subject matter, and FIGS. 2A through 2C are sectional views taken along a line of A-A' of FIG. 1.

Referring to FIGS. 1, and 2A through 2C, a semiconductor package may include a substrate 100, a semiconductor chip 120, a heat-dissipating part (e.g., a heat-dissipating region) 150, and a molding part (e.g., a molded region) 160. The substrate 100 may be, for example, a printed circuit board (PCB). The substrate 100 may include a circuit 105 configured to be coupled to a ground voltage node. A bottom surface of the substrate 100 may be electrically connected to an external terminal 110. The external terminal 110 may be, for example, a solder ball.

A top surface of the substrate 100 may include a first region for the semiconductor chip 120 and a second region in which a pad 130 may be formed. The pad 130 may be electrically connected to the circuit 105.

The semiconductor chip 120 may be mounted on the first region of the substrate 100 with chip connection patterns 125 interposed therebetween. The chip connection patterns 125 may be, for example, solder balls.

The heat-dissipating part 150 may be electrically connected to the pad 130, and a heat-dissipating part connection pattern 140 interposed between the heat-dissipating part 150 and the pad 130. The heat-dissipating part connection pattern 140 may be, for example, a solder ball, a conductive adhesive layer, or a thermal interface material (TIM) layer.

According to some embodiments, the heat-dissipating part 150 may be a carbon-containing region disposed in the molding part 160. For example, the heat-dissipating part 150 may include carbon fibers and/or carbon cloth. This may enable the heat-dissipating part 150 to have a low thermal expansion coefficient, and may reduce potential problems arising from a difference in thermal expansion coefficient between the heat-dissipating part 150 and the semiconductor chip 120 disposed adjacent thereto. The carbon-containing heat-dissipating part 150 may be thermally and electrically conductive. For example, the heat-dissipating part 150 may be connected to the ground circuit of the substrate 100, and thus, it can serve as a shield.

The top surface of the heat-dissipating part 150 may be located at a level that is substantially equivalent to or lower than that of the semiconductor chip 120. In example embodiments, the heat-dissipating part 150 may be spaced apart from the semiconductor chip 120 (for example, around the semiconductor chip 120 or along a periphery (edge) of the semiconductor chip 120). For example, in plan view, the heat-dissipating part 150 may be shaped like a rectangular ring.

In example embodiments, the molding part 160 may be formed such that it leaves the top surface of the semiconductor chip 120 exposed and covers side surfaces of the semiconductor chip 120, the chip connection patterns 125, the heat-dissipating part 150, and the heat-dissipating part connection pattern 140. In some embodiments, the molding part 160 may be an exposed-die mold underfill (e-MUF) structure. The molding part 160 may be understood as including an underfill layer and a molded layer covering the chip connection patterns 125 and the sidewalls of the semiconductor chip 120. However, in some embodiments, the molding part 160 may have a continuous structure without an interfacial surface formed between portions covering the chip connection patterns 125 and the semiconductor chip 120. In some embodiments, a process of forming the under-fill layer can be omitted such that the overall process can be simplified.

The heat-dissipating part 150 may be disposed adjacent to a periphery of the semiconductor chip 120 and it may have the top surface lower than that of the semiconductor chip 120. This may enable limitation of the total thickness of the semiconductor package. The heat-dissipating part 150 may reduce warping of the semiconductor package.

According to further example embodiments of the inventive subject matter, as shown in FIG. 2B, the molding part 160 may cover the semiconductor chip 120, the chip connection patterns 125, the heat-dissipating part 150, and the heat-dissipating part connection pattern 140. For example, the molding part 160 may have a structure in which an under-fill layer and a mold layer are combined to form a single element. In some embodiments, the molding part 160 may include an under-fill layer and a separate mold layer.

According to still further example embodiments of the inventive subject matter, as shown in FIG. 2C, a plurality of semiconductor chips 120a, 120b, and 120c may be provided on the substrate 100. The semiconductor chips 120a, 120b, and 120c may be vertically stacked. The semiconductor chips 120a, 120b, and 120c may be electrically connected via the chip connection patterns 125. In example embodiments, at least one of the semiconductor chips 120a, 120b, and 120c may be configured to include through-silicon-vias (TSV) 123. FIG. 2C shows the molding part 160 with an e-MUF structure, but in some embodiments, a structure that covers the semiconductor chips 120a, 120b, and 120c along the lines shown in FIG. 2B may be used.

FIGS. 3A and 3B are sectional views illustrating semiconductor packages according to further example embodiments of the inventive subject matter. FIGS. 3A and 3B are sectional views taken along line A-A' of FIG. 1. The semiconductor packages described with reference to FIG. 1 may be modified to have a second heat-dissipating part described with reference to FIGS. 3A and 3B.

Referring to FIGS. 1, 3A, and 3B, a semiconductor package may include a substrate 100, a semiconductor chip 120 provided on the substrate 100 and electrically connected to chip connection patterns 125, a first heat-dissipating part 150 disposed adjacent to the semiconductor chip 120 and electrically connected to the substrate 100 through a first heat-dissipating part connection pattern 140, a molding part 160 protecting the first heat-dissipating part 150 and the semiconductor chip 120, and a second heat-dissipating part 180 disposed on the molding part 160 and electrically connected to the first heat-dissipating part 150.

The substrate 100, the chip connection patterns 125, the first heat-dissipating part 150, the first heat-dissipating part connection pattern 140 may be configured to have substantially the same features as those of the previous embodiments described with reference to FIGS. 2A through 2C, and thus, detailed description thereon will be omitted below.

In example embodiments, the molding part 160 may be configured to have the e-MUF structure shown in FIG. 2A. In further embodiments, the molding part 160 may be configured to have the structure shown in FIG. 2B.

The second heat-dissipating part 180 may be disposed on the molding part 160. For example, the formation of the second heat-dissipating part 180 may include removing a portion of the molding part 160 to expose the top surface of the first heat-dissipating part 150, and then, forming a second heat-dissipating part connection pattern 165 electrically connected to the first heat-dissipating part 150. The second heat-dissipating part connection pattern 165 may be a solder ball, a silver paste or a conductive adhesive layer.

In example embodiments, the second heat-dissipating part 180 may be electrically connected to the ground circuit 105 of the substrate 100 through the first heat-dissipating part 150. Accordingly, the second heat-dissipating part 180 may serve as a shielding layer. An insulating adhesive layer 170 may be interposed between the semiconductor chip 120 and the second heat-dissipating part 180.

The structure of and material used for the second heat-dissipating part 180 may be variously modified, but for the sake of brevity, two example embodiments will be described below. It will be understood that the inventive subject matter is not be limited to the example embodiments described below.

According to some example embodiments of the inventive subject matter, as shown in FIG. 3A, the second heat-dissipating part 180 may be a heat slug, which may contain metal (e.g., copper).

According to further example embodiments of the inventive subject matter, as shown in FIG. 3B, the second heat-dissipating part 180 may include a graphite layer 174. For example, the second heat-dissipating part 180 may include a conductive adhesive layer 172 including the graphite layer 174 disposed therein. A support layer 176 may be additionally provided on the conductive adhesive layer 172.

According to the structures of FIGS. 3A and 3B, since the semiconductor package has the second heat-dissipating part 180 as well as the first heat-dissipating part 150, heat-dissipation efficiency thereof may be increased. The first and second heat-dissipating parts 150 and 180 may be electrically connected to the ground circuit to provide shielding.

Figure 4B:
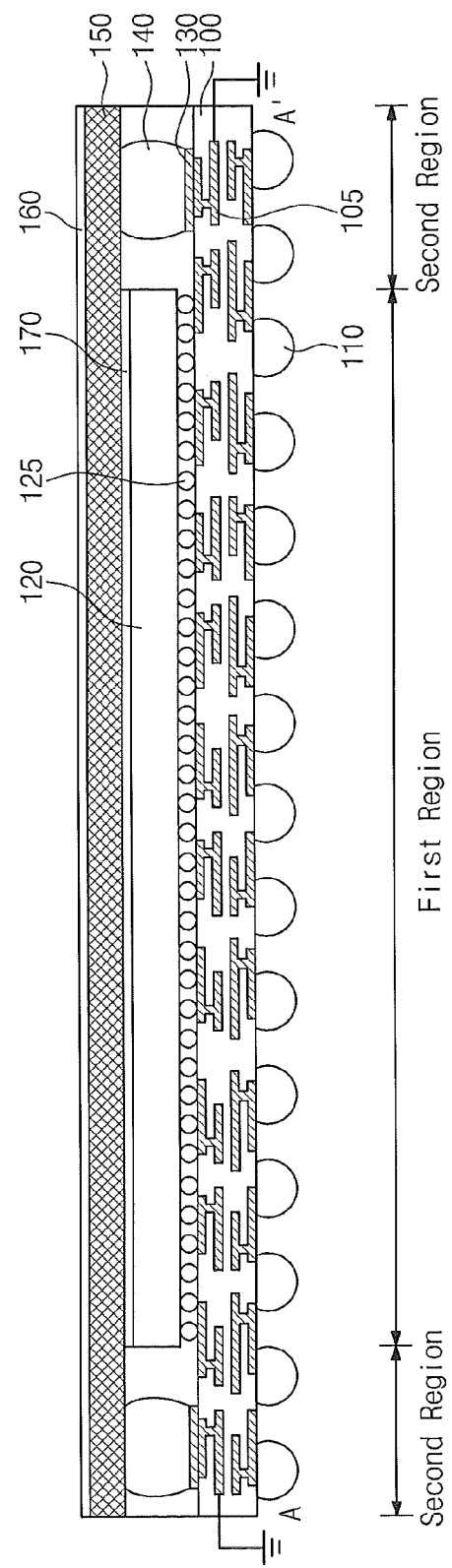
FIG. 4B is a sectional view illustrating a semiconductor package according to still further example embodiments of the inventive subject matter.

FIG. 4A is a plan view illustrating a semiconductor package according to still further example embodiment of the inventive subject matter, and FIG. 4B is a sectional view taken along line A-A' of FIG. 4A.

Referring to FIGS. 4A and 4B, a semiconductor package may include a substrate 100, a semiconductor chip 120 disposed on the substrate 100 and electrically connected to chip connection patterns 125, a heat-dissipating part 150 disposed on the semiconductor chip 120 and electrically connected to the substrate 100 through a heat-dissipating part connection pattern 140, and a molding part 160 protecting the heat-dissipating part 150 and the semiconductor chip 120.

The substrate 100, the chip connection patterns 125, the heat-dissipating part 150, the heat-dissipating part connection pattern 140 and molding part 160 may be configured to have substantially similar features as those of the previous embodiments described with reference to FIGS. 2A through 2C, although there may be some differences in terms of a disposition of the heat-dissipating part 150 and a structure of the molding part 160, as will described below. Accordingly, for the sake of brevity, repeated detailed description thereon will be omitted below.

The heat-dissipating part 150 may cover the top surface of the semiconductor chip 120 and extend toward an edge of the substrate 100, where the heat-dissipating part connection pattern 140 may be provided. An insulating adhesive layer 170 may be additionally provided between the semiconductor chip 120 and the heat-dissipating part 150. Since the heat-dissipating part 150 may cover the whole top surface of the semiconductor chip 120, the device may provide improved heat-dissipation efficiency and shielding in comparison to the devices of FIGS. 2A through 2C. However, due to the location of the heat-dissipating part 150 on the semiconductor chip 120, the total thickness of the semiconductor package may increase.

The molding part 160 may cover the heat-dissipating part 150. In example embodiments, the molding part 160 may cover the semiconductor chip 120, the chip connection patterns 125, the heat-dissipating part 150, and the heat-dissipating part connection pattern 140 that are provided below the heat-dissipating part 150. For example, the molding part 160 may have a structure, in which an under-fill layer and a mold layer are combined to form a single element. Alternatively, the molding part 160 may include an under-fill layer and a mold layer that can be differentiated.

Hereinafter, examples of package-on-package (PoP)-type semiconductor devices realized with the semiconductor packages according to example embodiments of the inventive subject matter will be described.

Figure 5A:
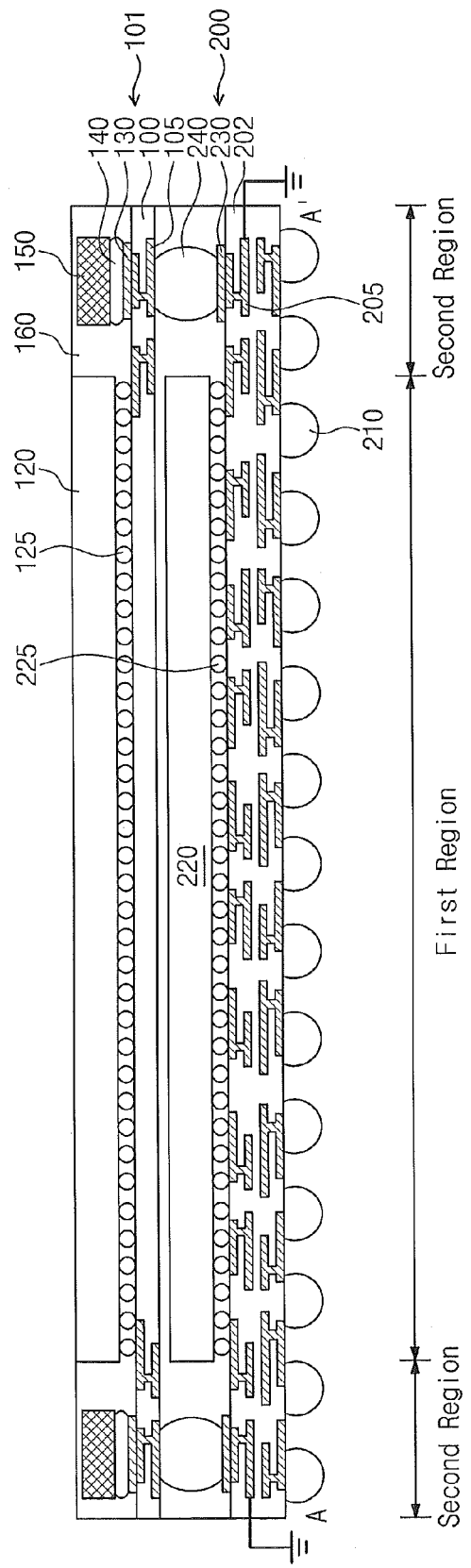
FIGS. 5A and 5B are sectional views illustrating semiconductor devices according to example embodiments of the inventive subject matter.
Figure 5B:
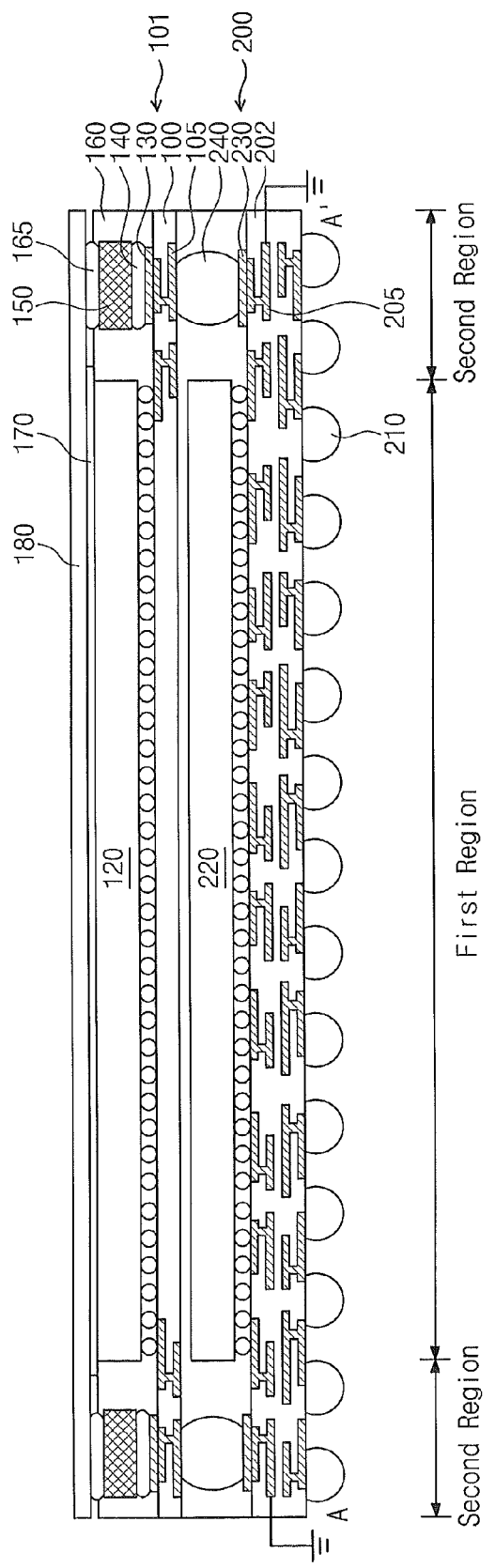

FIGS. 5A and 5B are sectional views illustrating semiconductor devices according to example embodiment of the inventive subject matter. FIGS. 5A and 5B are sectional views taken along line A-A' of FIG. 1. Although a first package to be described with reference to FIGS. 5A and 5B is not shown in the plan view of FIG. 1, FIGS. 5A and 5B, the semiconductor device of FIGS. 5A and 5B may be configured to have the plan view of FIG. 1.

Referring to FIGS. 5A and 5B, the semiconductor device may include a first package 200, a second package 101 mounted on the first package 200, and a connecting portion 240 connecting the first and second packages 101 and 200.

The first package 200 may include a first substrate 202 and a first semiconductor chip 220 mounted on the first substrate 202. An external terminal 210 may be provided on one surface of the first substrate 202, and a pad 230 may be provided on the other surface of the first substrate 202. The first substrate 202 may include a ground circuit 205 configured to be connected to a ground voltage node.

The second package 101 may include the second substrate 100, a second semiconductor chip 120 mounted on the second substrate 100, and a heat-dissipating part 150 provided adjacent to the second semiconductor chip 120 on the second substrate 100. The second package 101 may take the form, for example, of one of the semiconductor packages described with reference to FIGS. 2A, 2B, 2C, 3A, 3B, and FIG. 4B.

The connecting portion 240 may connect the first package 200 electrically to the second package 101. For example, the connecting portion 240 may be a solder ball.

According to further example embodiments of the inventive subject matter, as shown in FIG. 5B, the second package 101 may include a second substrate 100, a second semiconductor chip 120, a first heat-dissipating part 150, and a second heat-dissipating part 180. The second package 101 may take the form, for example, of one of the semiconductor packages described with reference to FIGS. 3A and 3B.

FIGS. 6A through 10A are plan views illustrating operations for fabricating a semiconductor package according to example embodiments of the inventive subject matter. FIGS. 6B through 10B are sectional views taken along line A-A' of FIGS. 6A through 10A, respectively.

Figure 6A:
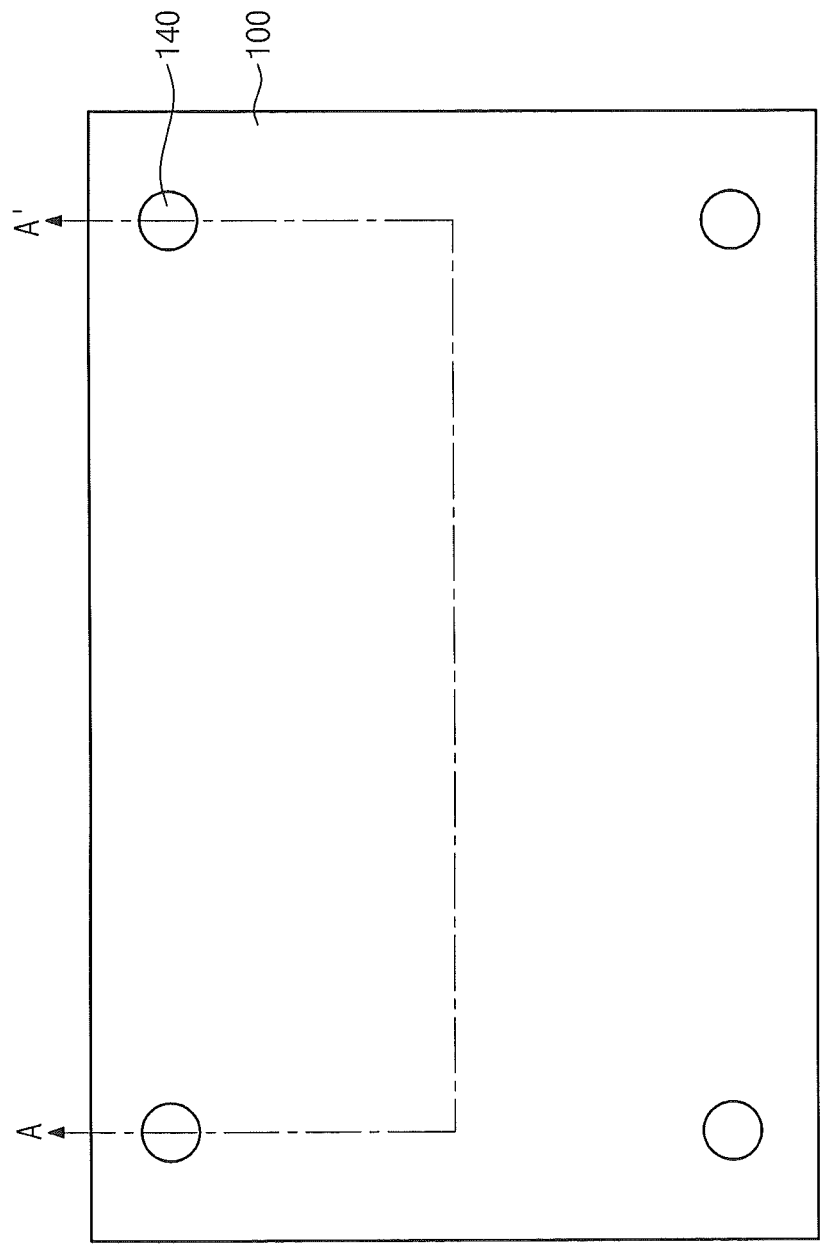

Referring to FIGS. 6A and 6B, a first heat-dissipating part connection pattern 140 may be formed on a substrate 100 provided with a pad 130. The first heat-dissipating part connection pattern 140 may be formed on the pad 130. For example, the first heat-dissipating part connection pattern 140 may be a solder ball or a conductive adhesive layer.

The substrate 100 may include a first region for a semiconductor chip 120 and a second region for the pad 130. The pad 130 may be electrically coupled to a ground circuit 105 of the substrate 100.

Figure 7A:
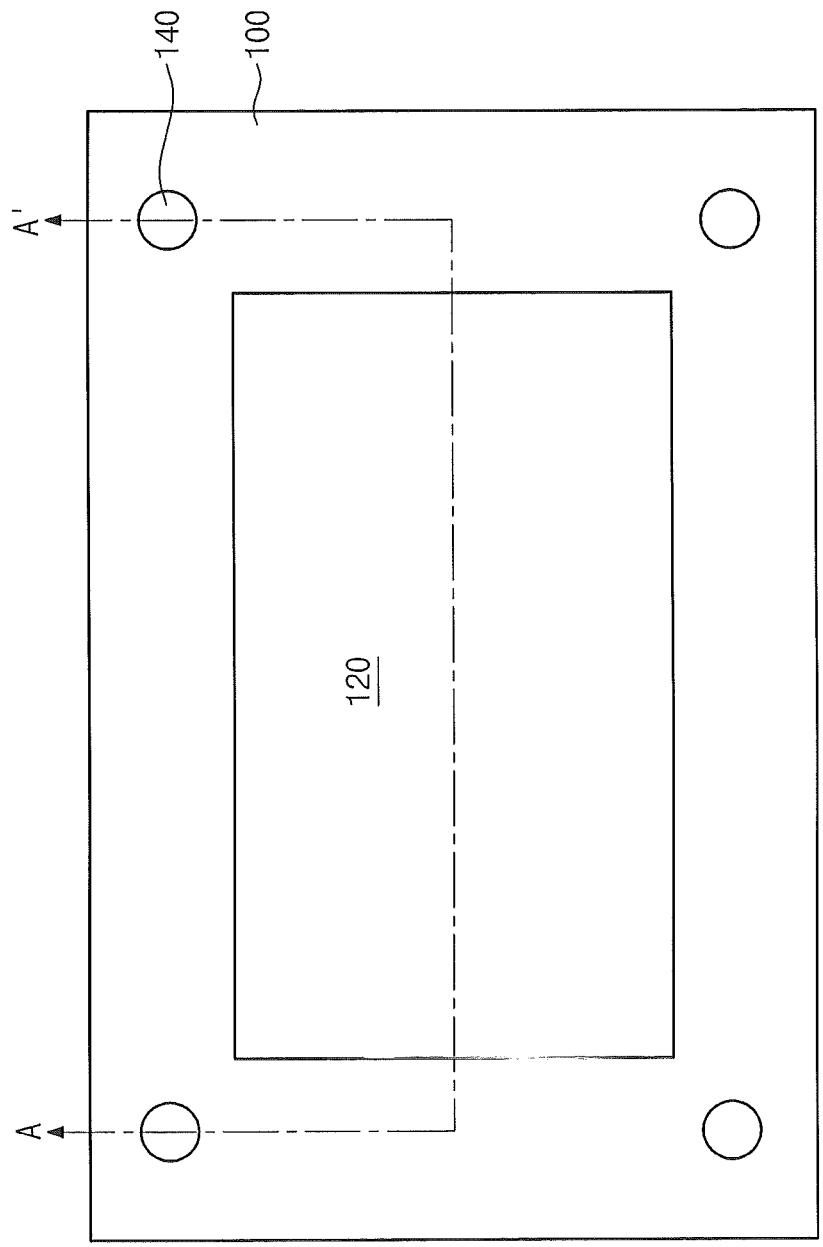
Figure 7B:
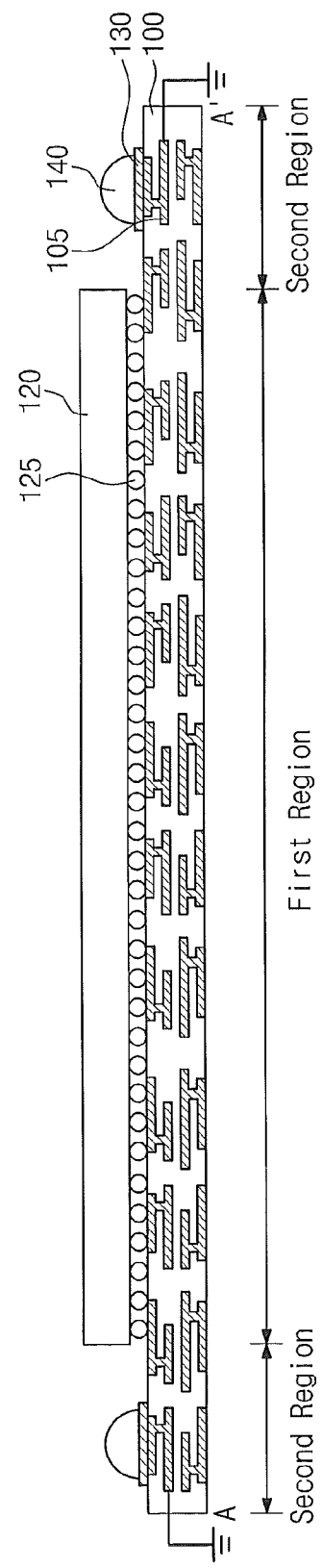

Referring to FIGS. 7A and 7B, the semiconductor chip 120 with the chip connection patterns 125 may be placed on the first region of the substrate 100. In this stage, the chip connection patterns 125 may be in a state that it is not attached to the substrate 100.

Figure 8B:
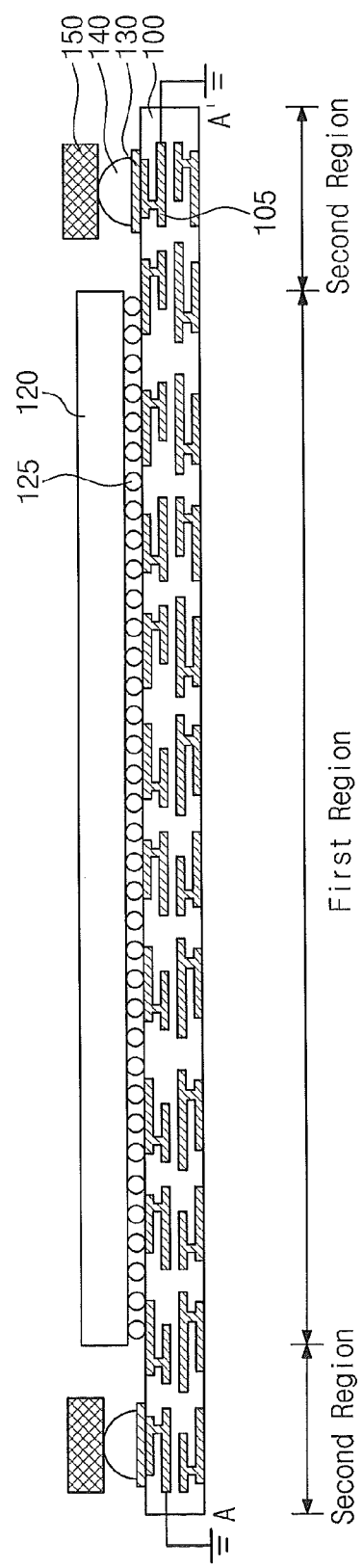

Referring to FIGS. 8A and 8B, a first heat-dissipating part 150 may be placed on the first heat-dissipating part connection pattern 140. In some example embodiments, the first heat-dissipating part 150 may be shaped like a rectangular ring (in plan view). The first heat-dissipating part 150 may contain carbon. The first heat-dissipating part 150 may include, for example, carbon fibers and/or carbon cloth. In this stage, the first heat-dissipating part 150 may be in a state that it is not attached to the first heat-dissipating part connection pattern 140.

Figure 9A:
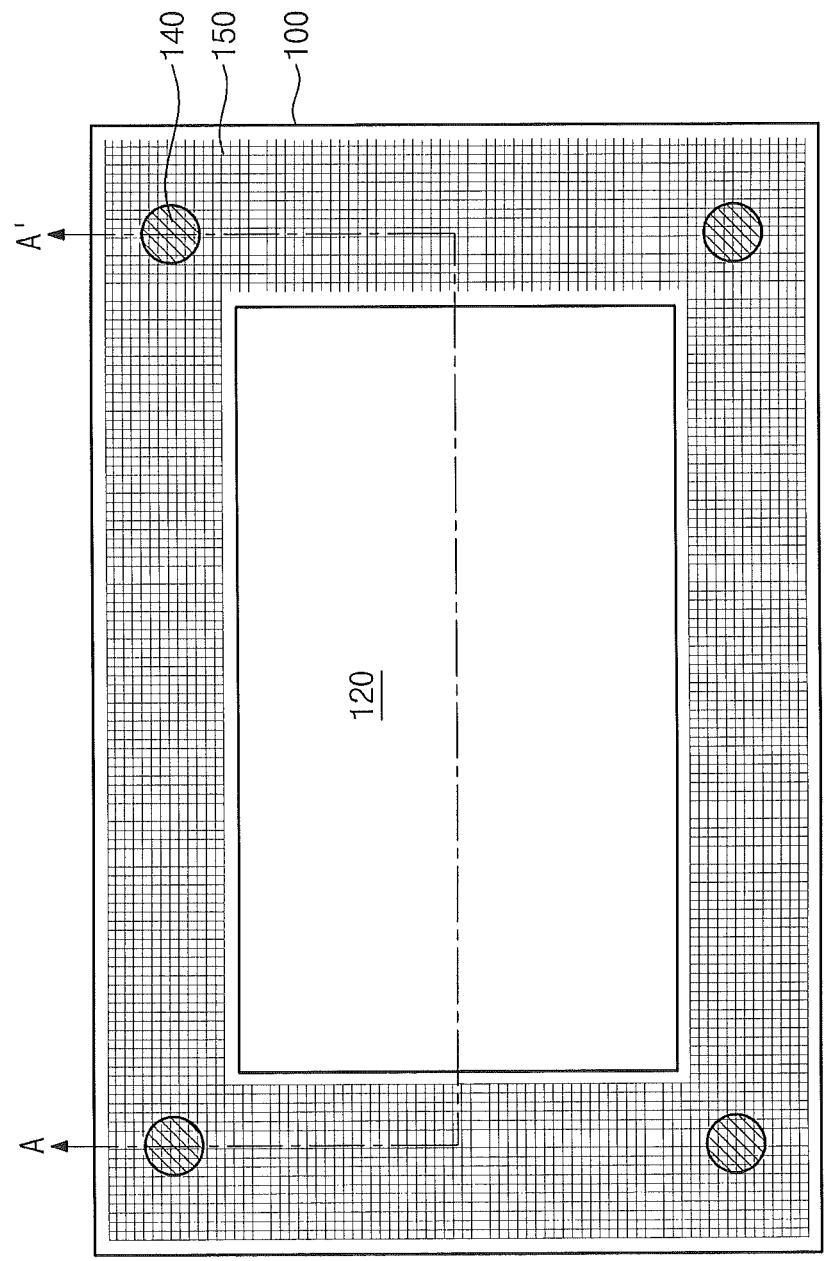
Figure 9B:
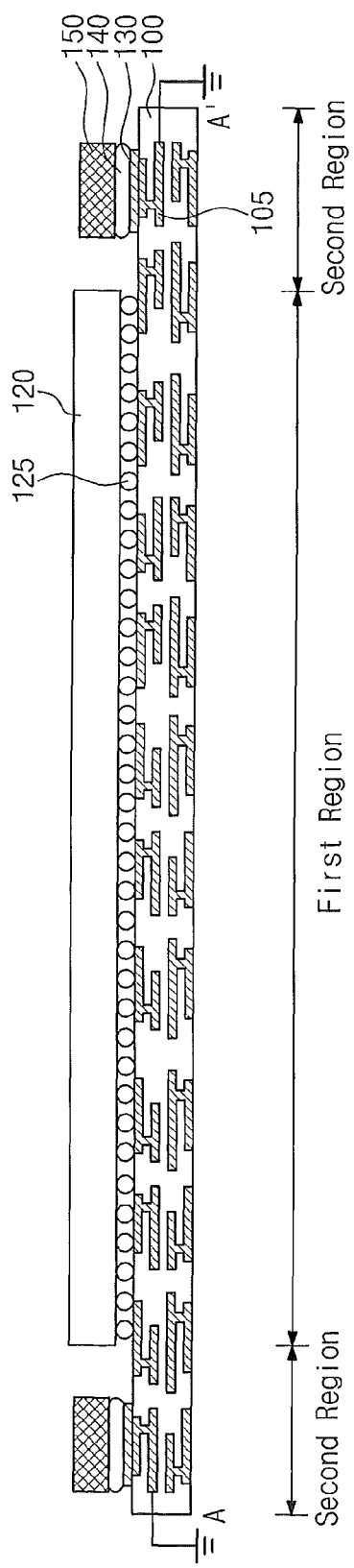

Referring to FIGS. 9A and 9B, a reflow process may be performed to attach the semiconductor chip 120 to the substrate 100 with the chip connection patterns 125 and to attach the first heat-dissipating part 150 to the pad 130 with the first heat-dissipating part connection pattern 140.

Figure 10B:
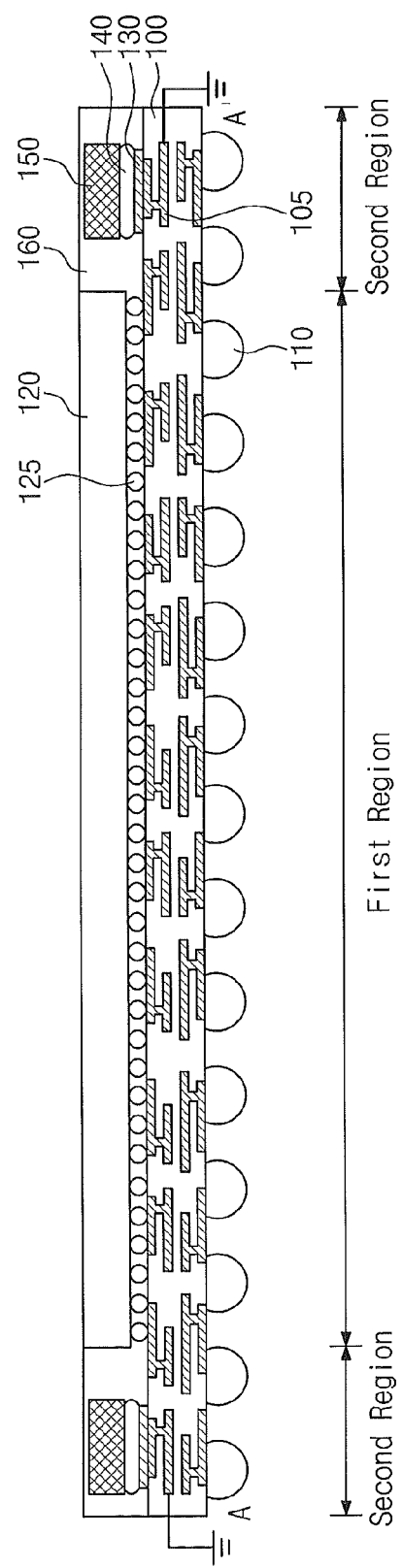

Referring to FIGS. 10A and 10B, a molding part 160 may be formed on the substrate 100 to protect the semiconductor chip 120 and the first heat-dissipating part 150. In some example embodiments, the molding part 160 may be formed in an e-MUF manner, i.e., the molding part 160 may be formed to leave the top surface of the semiconductor chip 120 exposed without an under-fill process. According to further example embodiments of the inventive subject matter, as shown in FIGS. 2B and 2C, the molding part 160 may cover the semiconductor chip 120 and the first heat-dissipating part 150.

FIG. 11A through 13A are plan views illustrating a method of fabricating a semiconductor package according to further example embodiments of the inventive subject matter, and FIG. 11B through 13B are sectional views taken along line A-A' of FIG. 11A through 13A, respectively.

By using the process described with reference to FIGS. 6A through 10A and 6B through 10B, the semiconductor chip 120, the chip connection patterns 125, the first heat-dissipating part 150, the first heat-dissipating part connection pattern 140, and the molding part 160 may be formed on the substrate 100.

Figure 11A:
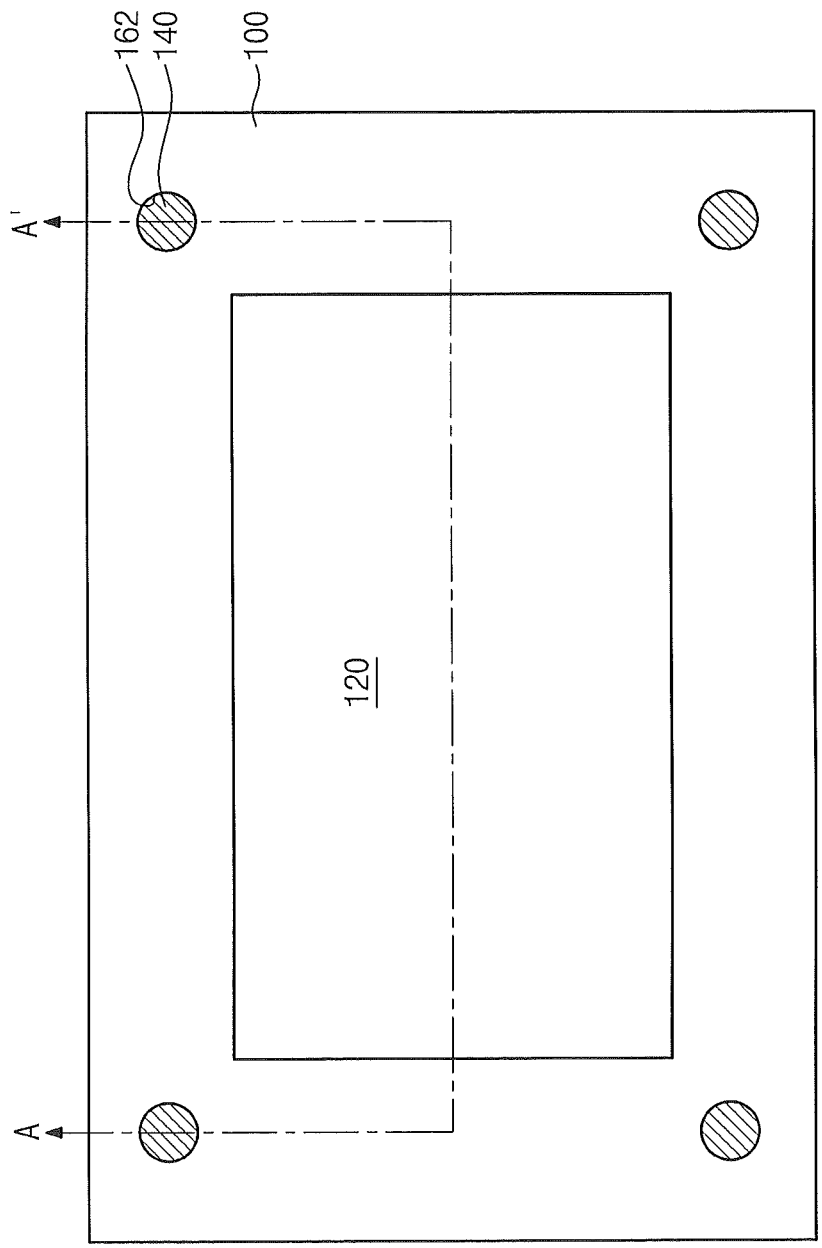

Referring to FIGS. 11A and 11B, the molding part 160 may be partially etched to form an opening 162 exposing a top surface of the first heat-dissipating part 150. For example, the partial etching of the molding part 160 may be performed using a laser.

Figure 12A:
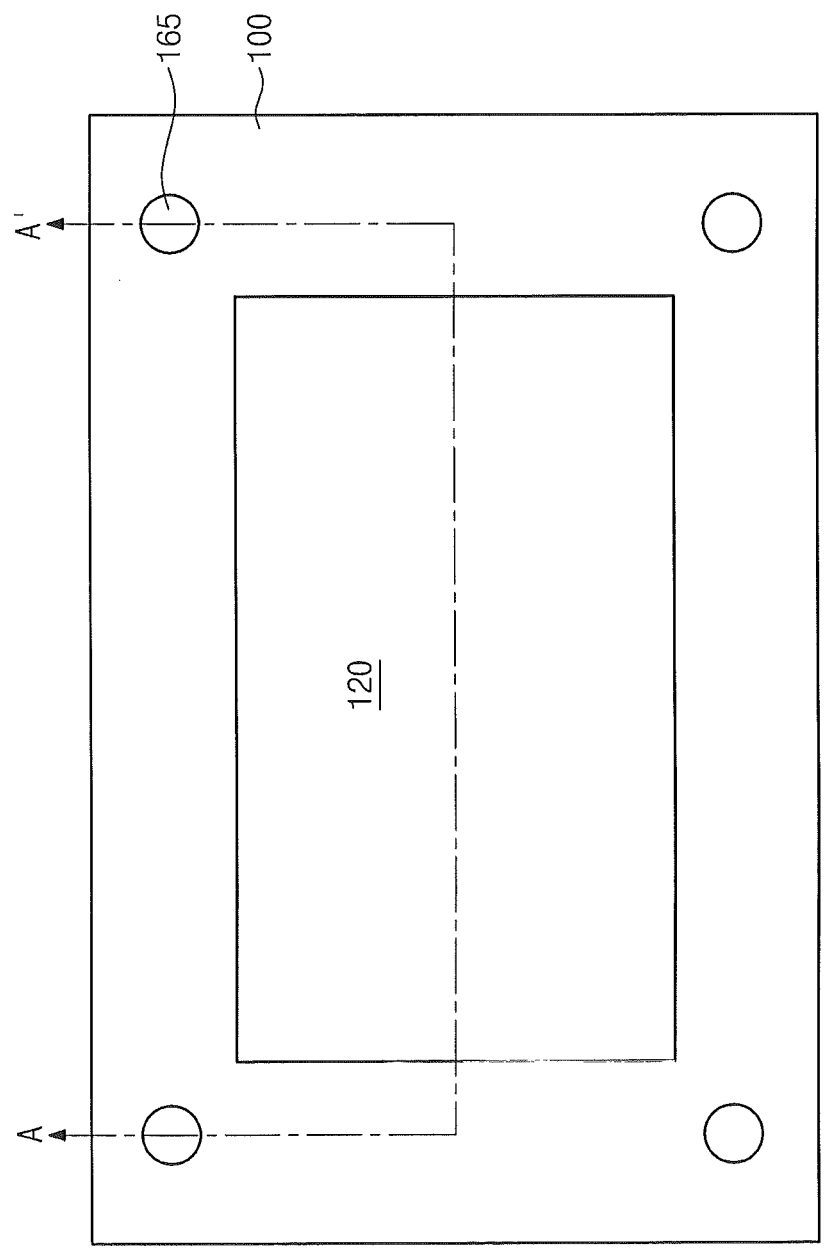
Figure 12B:
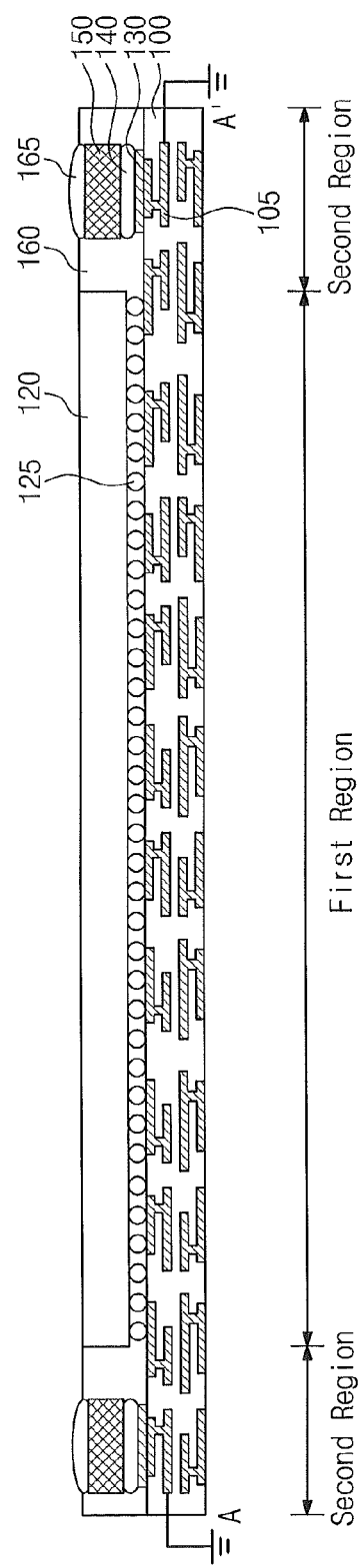

Referring to FIGS. 12A and 12B, a second heat-dissipating part connection pattern 165 may be formed in the opening 162. For example, the second heat-dissipating part connection pattern 165 may be a solder ball or a conductive adhesive layer.

Figure 13A:
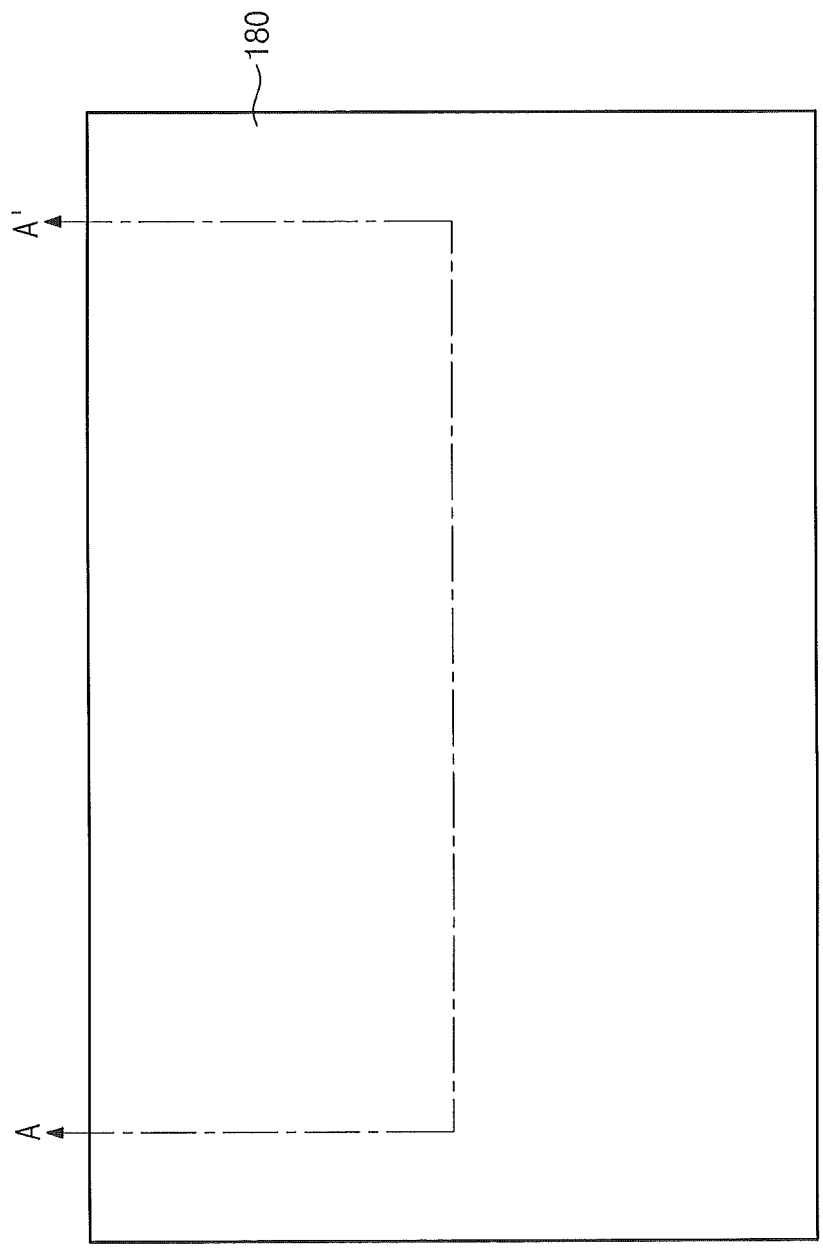
Figure 13B:
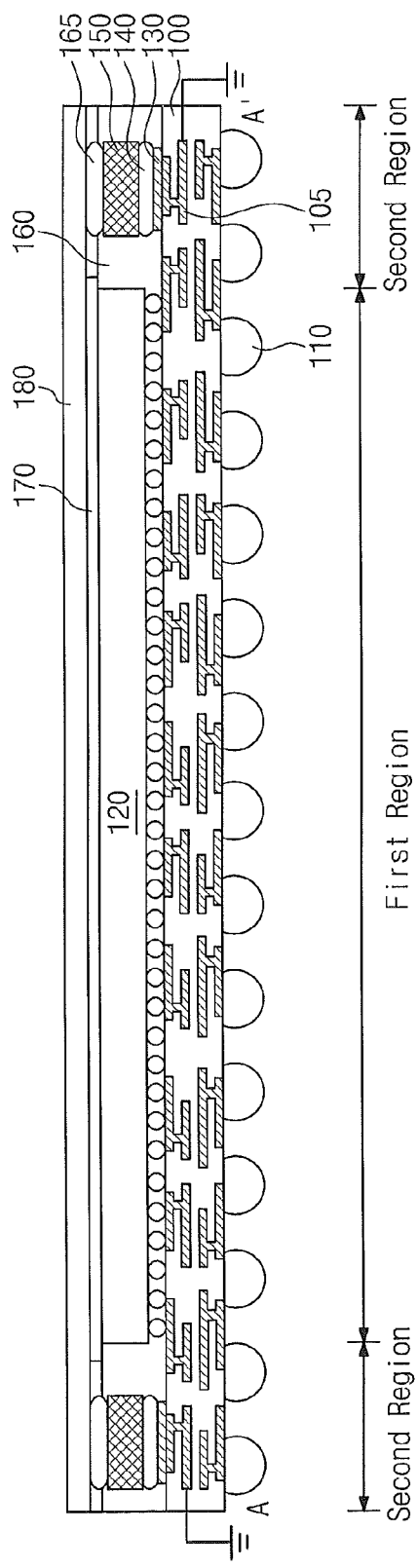

Referring to FIGS. 13A and 13B, a second heat-dissipating part 180 may be disposed on an insulating adhesive layer 170 and the second heat-dissipating part connection pattern 165. In some example embodiments, the second heat-dissipating part 180 may be a heat slug that contains metal (e.g., copper) or a conductive adhesive layer including graphite. The insulating adhesive layer 170 may be formed on the top surface of the semiconductor chip 120 left exposed by the molding part 160.

A reflow process may be performed to attach the second heat-dissipating part 180 to the semiconductor chip 120 and the second heat-dissipating part connection pattern 165 with the insulating adhesive layer 170 and the second heat-dissipating part connection pattern 165.

As described above, the second heat-dissipating part 180 may be electrically separated from the semiconductor chip 120 and be electrically connected to the first heat-dissipating part 150 by the second heat-dissipating part connection pattern 165. Since the first heat-dissipating part 150 is connected to the ground circuit 105, the second heat-dissipating part 180 may be connected to the ground circuit 105. This may provide increased shielding. In addition, the first heat-dissipating part 150 may have a low thermal expansion coefficient, due to carbon contained therein. This may reduce problems arising from a difference in thermal expansion coefficient between the first heat-dissipating part 150 and the semiconductor chip 120 disposed adjacent thereto. Since the first heat-dissipating part 150 contains a conductive material, it can serve as a heat-dissipating element. Since the semiconductor package has the second heat-dissipating part 180 as well as the first heat-dissipating part 150, heat-dissipation efficiency may be increased.

Figure 14A:
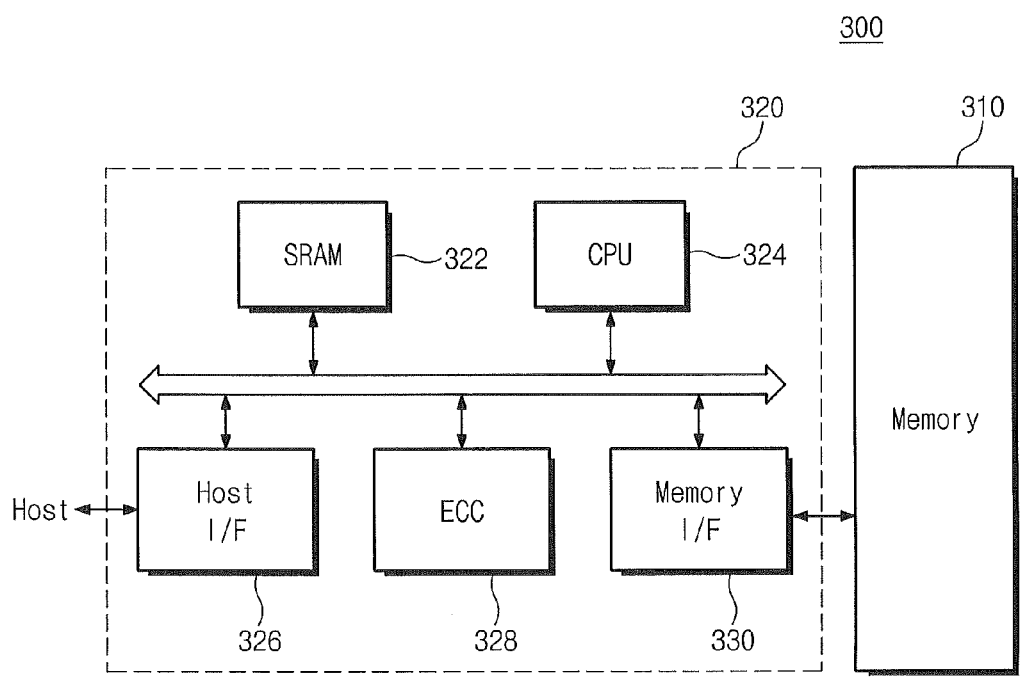
FIG. 14A is a block diagram illustrating a memory card including a semiconductor package according to example embodiments of the inventive subject matter.

FIG. 14A is a block diagram illustrating a memory card including a semiconductor package according to example embodiments of the inventive subject matter.

Referring to FIG. 14A, a semiconductor device according to exemplary embodiments of the inventive subject matter may be applied to form a memory card 300. The memory card 300 may include a memory controller 320 to control a data exchange between a host and a semiconductor device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the semiconductor device 310. A memory interface 330 can interface with the semiconductor device 310. The central processing unit 324 can control data exchange of the memory controller 320 with, for example, the semiconductor device 310.

The semiconductor device 310 applied to realize the memory card 300 may be configured to have substantially the same technical features as those according to example embodiments of the inventive subject matter, and thus, the memory card 300 can have improvement in terms of heat-dissipation efficiency and shielding characteristics.

Figure 14B:
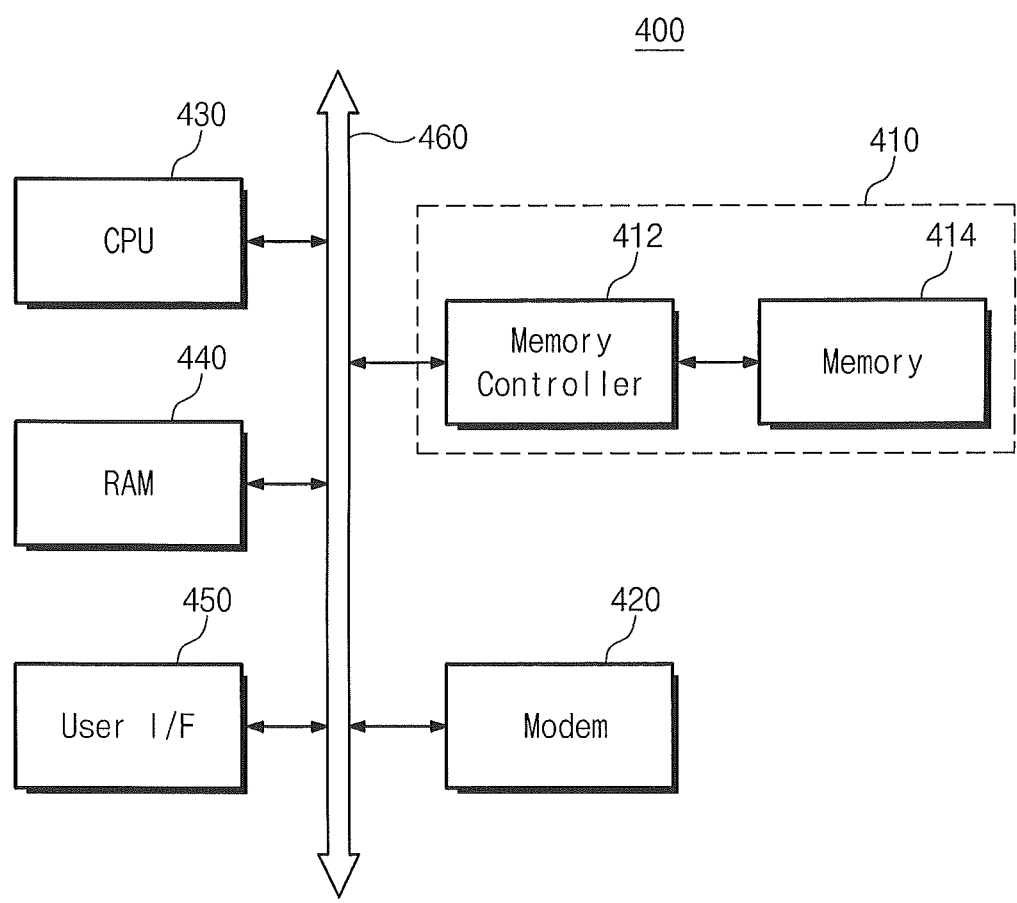
FIG. 14B is a block diagram illustrating an information processing system including a memory device according to example embodiments of the inventive subject matter.

FIG. 14B is a block diagram illustrating an information processing system including a memory device according to example embodiments of the inventive subject matter.

Referring to FIG. 14B, an information processing system 400 may include a semiconductor device according to exemplary embodiments of the inventive subject matter. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 14A. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive subject matter, a carbon-containing heat-dissipating part may be provided in a molding part to improve warpage of a thin semiconductor package. Accordingly, it is possible to reduce a total thickness of the semiconductor package. In addition, since the carbon-containing heat-dissipating part has a low thermal expansion coefficient and be electrically conductive, the semiconductor package and a semiconductor device with the same can have excellent heat-dissipation efficiency and shielding characteristics.

While example embodiments of the inventive subject matters have been particularly shown and described, it will be understood by one of ordinary skill in the art that variations in form and detail may be made therein without departing from the spirit and scope of the attached claims.

What is claimed is:

1. A semiconductor package, comprising:
   a substrate;
   a ground circuit supported by the substrate;
   at least one semiconductor chip disposed on the substrate; and
   a carbon-containing heat-dissipating part disposed on the substrate adjacent a periphery of and not overlapping the at least one semiconductor chip and electrically connected to the ground circuit.

2. The semiconductor package of claim 1, wherein the heat-dissipating part comprises carbon fibers and/or carbon cloth.

3. The semiconductor package of claim 1, further comprising a connection pattern disposed adjacent to the at least one semiconductor chip and configured to electrically connect the ground circuit to the heat-dissipating part.

4. The semiconductor package of claim 1, wherein the heat-dissipating part has a top surface that is lower than or substantially coplanar with a top surface of the at least one semiconductor chip.

5. The semiconductor package of claim 1, further comprising a molding part covering the heat-dissipating part.

6. The semiconductor package of claim 1, further comprising a molding part disposed on the substrate and covering the semiconductor chip and the heat-dissipating part.

7. The semiconductor package of claim 1, wherein the heat-dissipating part comprises a first heat-dissipating part disposed adjacent a periphery of the semiconductor chip and wherein the package further comprises a second heat-dissipating part overlying the semiconductor chip and the first heat-dissipating pattern and electrically connected to the first heat-dissipating part via a pattern disposed between the first and second heat-dissipating patterns.

8. The semiconductor package of claim 7, wherein the second heat-dissipating part comprise a metal and/or graphite.

9. The semiconductor package of claim 1, wherein the at least one semiconductor chip comprises a plurality of semiconductor chips stacked on the substrate.

10. A semiconductor device, comprising:
    a first semiconductor package comprising a first substrate, at least one first semiconductor chip disposed on the first substrate and a ground circuit supported by the first substrate;
    a second package disposed on the first package and comprising a second substrate, at least one second semiconductor chip disposed on the second substrate, and a carbon-containing heat-dissipating part disposed on the substrate; and
    a connecting part connecting the heat-dissipating part of the second package to the ground circuit of the first package.

11. The device of claim 10, wherein the second package further comprises a molding part disposed on the second substrate and covering the heat-dissipating part.

12. The device of claim 10, wherein the heat-dissipating part is disposed along a periphery of the at least one second semiconductor chip and has a top surface that is lower than or substantially coplanar with a top surface of the at least one second semiconductor chip.

13. The device of claim 10, wherein the heat-dissipating part comprises a first heat-dissipating part disposed along a periphery of the at least one second semiconductor chip and wherein the device further includes a second heat-dissipating part electrically connected to the first heat-dissipating part and comprising metal and/or graphite.

14. A packaged semiconductor device comprising:
    a substrate;
    a ground circuit supported by the substrate;
    at least one semiconductor chip disposed on the substrate;
    a molded region disposed on the substrate and conforming to at least one sidewall of the at least one semiconductor chip; and
    a carbon-containing region disposed in the molded region adjacent a periphery of the at least one semiconductor chip and connected to the ground circuit.

15. The packaged semiconductor device of claim 14, wherein the carbon-containing region is thermally and electrically conductive.

16. The packaged semiconductor device of claim 14, wherein the molded region at least partially covers a top surface of the at least one semiconductor chip.

17. The packaged semiconductor device of claim 14, further comprising a metal and/or graphite region overlying the at least one semiconductor chip and connected to the carbon-containing region.

18. The packaged semiconductor device of claim 14, wherein the carbon-containing region comprises carbon fibers and/or carbon cloth.

19. The semiconductor package of claim 1, wherein the heat dissipating part comprises a rectangular pattern extending completely around the periphery of the at least one semiconductor chip.

* * * * *